United States Patent
Driessen et al.

(10) Patent No.: US 12,376,250 B2
(45) Date of Patent: Jul. 29, 2025

(54) SHEET METAL PART FOR USE IN A HOUSING FOR ACCOMMODATING DEVICES SUCH AS ELECTRICAL, ELECTRONIC AND OPTICAL DEVICES

(71) Applicants: MINKELS B.V., Veghel (NL); LEGRAND SNC, Limoges (FR); LEGRAND FRANCE, Limoges (FR)

(72) Inventors: Petrus Hendrijus Driessen, Asten (NL); Olaf De Jong, Den Bosch (NL)

(73) Assignees: MINKELS B.V., Ac Veghel (NL); LEGRAND SNC, Limoges (FR); LEGRAND FRANCE, Limoges (FR)

( * ) Notice: Subject to any disclaimer, the term of this patent is extended or adjusted under 35 U.S.C. 154(b) by 378 days.

(21) Appl. No.: 17/916,023

(22) PCT Filed: Mar. 29, 2021

(86) PCT No.: PCT/EP2021/058203
§ 371 (c)(1),
(2) Date: Sep. 29, 2022

(87) PCT Pub. No.: WO2021/198206
PCT Pub. Date: Oct. 7, 2021

(65) Prior Publication Data
US 2023/0142371 A1 May 11, 2023

(30) Foreign Application Priority Data
Mar. 31, 2020 (NL) .................................. 2025247

(51) Int. Cl.
*H05K 5/13* (2025.01)
*H05K 5/04* (2006.01)
(Continued)

(52) U.S. Cl.
CPC .............. *H05K 5/13* (2025.01); *H05K 5/04* (2013.01); *F16B 5/02* (2013.01); *F16B 17/008* (2013.01)

(58) Field of Classification Search
CPC ..................................................... H05K 5/0008
See application file for complete search history.

(56) References Cited

U.S. PATENT DOCUMENTS 2,169,181 A * 8/1939 Kost ...................... F16B 21/20
411/918
2,342,170 A * 2/1944 Tinnerman ............ F16B 5/0208
411/246
(Continued)

FOREIGN PATENT DOCUMENTS

DE 102014204292 A1 9/2015
EP 2525636 A2 11/2012
(Continued)

OTHER PUBLICATIONS

Applicant: Minkels B.V.; "A Sheet Metal Part for use in a Housing for Accommodating Devices such as Electrical, Electronic and Optical Devices"; International Patent Application No. PCT/EP2021/058203; PCT International Search Report and Written Opinion; Jun. 25, 2021; 12 pgs.
(Continued)

*Primary Examiner* — Joshua K Ihezie
(74) *Attorney, Agent, or Firm* — Tarolli, Sundheim, Covell & Tummino LLP

(57) ABSTRACT

A sheet metal part for use in housing for accommodating devices such as electrical, electronic and optical devices is described. The sheet metal part comprises a penetrable opening through which the shank of a screw may be provided to bring the penetrable opening from an unpenetrated state to a penetrated state. The penetrable opening in the unpenetrated state is covered by an airtight coating layer, has (Continued)

a central area configured to accommodate a threaded shank of the screw and a lug extending radially outward from the central area over some distance, and the lug of the penetrable opening is configured to be bent back with the central area without coming loose from the sheet metal part when the penetrable opening is brought in the penetrated state by the shank of the screw.

20 Claims, 4 Drawing Sheets

(51) Int. Cl.
*F16B 5/02* (2006.01)
*F16B 17/00* (2006.01)

(56) References Cited

U.S. PATENT DOCUMENTS

| | | | | |
|---|---|---|---|---|
| 2,355,486 | A * | 8/1944 | Tinnerman | F16B 39/30 411/311 |
| 2,754,717 | A * | 7/1956 | Becker | F16B 21/20 79/2 |
| 2,804,116 | A * | 8/1957 | Van Niel | F16B 5/02 411/247 |
| 3,798,710 | A * | 3/1974 | Tinnerman | E04F 13/0814 24/457 |
| 4,305,114 | A * | 12/1981 | Takagi | H02B 1/36 361/609 |
| 6,183,182 | B1 * | 2/2001 | Baumgartner | E04D 3/3603 411/533 |
| 6,189,635 | B1 * | 2/2001 | Schuler | B60R 16/04 180/68.5 |
| 6,640,517 | B2 * | 11/2003 | Mitchell | F16B 17/006 403/361 |
| 10,591,087 | B1 * | 3/2020 | McCoy | F16L 1/10 |
| 10,785,898 | B1 * | 9/2020 | Lin | H05K 9/0015 |
| 11,203,166 | B2 * | 12/2021 | Mayer | B29C 66/0222 |
| 2002/0194803 | A1 * | 12/2002 | Mitchell | F16B 17/006 52/297 |
| 2012/0049706 | A1 * | 3/2012 | Cottuli | H05K 7/20736 312/236 |
| 2014/0079510 | A1 * | 3/2014 | Suzuki | F16B 33/02 411/411 |
| 2015/0125201 | A1 * | 5/2015 | Diehl | B29C 66/21 403/280 |
| 2016/0241002 | A1 * | 8/2016 | Tremaine | H02B 1/44 |
| 2017/0058934 | A1 * | 3/2017 | Haak | F16B 25/106 |
| 2018/0213667 | A1 * | 7/2018 | Midday | H05K 5/06 |
| 2018/0215105 | A1 * | 8/2018 | Mayer | B29C 65/603 |
| 2020/0263722 | A1 * | 8/2020 | Böckler | F24C 15/08 |
| 2021/0095475 | A1 * | 4/2021 | Zheng | F16B 33/004 |
| 2023/0142371 | A1 * | 5/2023 | Driessen | H05K 7/18 361/600 |

FOREIGN PATENT DOCUMENTS

| | | |
|---|---|---|
| GB | 488049 A | 6/1938 |
| GB | 912610 A | 12/1962 |
| KR | 910005345 U | 4/1991 |
| KR | 20090042751 A | 4/2009 |
| NL | 2008770 C2 | 11/2013 |
| RU | 2004126755 C2 | 2/2006 |

OTHER PUBLICATIONS

Applicant(s) Minkels B.V.; "A Sheet Metal Part for use in a Housing for Accommodating Devices such as Electrical, Electronic and Optical Devices"; Application No. 2022124062/07(051888) Filed: Mar. 29, 2021; Search Report dated May 22, 2024; 7 pgs.

* cited by examiner

SHEET METAL PART FOR USE IN A HOUSING FOR ACCOMMODATING DEVICES SUCH AS ELECTRICAL, ELECTRONIC AND OPTICAL DEVICES

CROSS-REFERENCE TO RELATED APPLICATION

This patent application is a U.S. National Stage Application filed under 35 U.S.C. § 371 of PCT/EP2021/058203, filed Mar. 29, 2021, and entitled A SHEET METAL PART FOR USE IN A HOUSING FOR ACCOMMODATING DEVICES SUCH AS ELECTRICAL, ELECTRONIC AND OPTICAL DEVICES, which International Applications claims the benefit and priority of Netherlands Patent Application No. 2025247, filed on Mar. 31, 2020, the disclosure of which is incorporated by reference herein in its entirety as part of the present application.

TECHNICAL FIELD OF THE INVENTION

The invention relates to a sheet metal part for use in housing for accommodating devices such as electrical, electronic and optical devices, and/or for use in a corridor between such housings.

The invention further relates to an assembly of a sheet metal part according to any one of the preceding claims and a device or other part connected thereto, the connection being provided by a screw with head from which a shank emanates that is provided through a penetrable opening. Such an assembly is typically used in housing for accommodating devices such as electrical, electronic and optical devices, and/or in a corridor between such housings.

The invention further relates to such housing for accommodating devices comprising electrical, electronic and optical devices, wherein the housing comprises at least one sheet metal part and/or assembly in accordance with the invention.

BACKGROUND OF THE INVENTION

Housings for accommodating devices such as electrical, electronic and optical equipment, in particular computer equipment, have been known for some time. Non-limiting examples of applicable electronic equipment comprise servers, network hardware and sound technology equipment. Housings that may be used in business applications for instance, may comprise racks that are typically open-walled, apart from a roof, and cabinets that typically comprise side walls as well. Such housings comprise a load bearing frame of interconnected frame members, which include floor frame members, vertically oriented side frame members, and roof frame members. Vertically oriented mounting rails for suspending equipment may be provided against and/or in between side frame members. Each mounting rail may be connected to a floor and a roof frame member. One example of such housing is a so-called 19 inch housing, which comprises a number of vertically oriented mounting rails that extend parallel to each other at a mutual standardized distance of typically 17.7 inches. Each mounting rail is provided with a plurality of openings or other receivers, extending along a longitudinal direction of each mounting rail and provided at equal height between mounting rails. Standardized, optionally modular, equipment may be typically 17.7 inches wide at most, and may further be provided with fixation lips to be connected to the openings or receivers, for instance by screws. In this way, multiple units of equipment may be suspended on top of each other in the same housing.

It should be noted that a housing comprising the invented sheet metal part and/or assembly is not limited to the above-described 19 inch housing, and the invention is equally applicable to other housings, preferably with standardized dimensions, such as 23 inch or metric housings, that are for instance used in telecommunication. The invention also applies to other sheet metal parts outside such housings, for instance as used in corridors between such housings.

There is a continuous drive in the art to improve the housings with respect to strength, stiffness, cooling, prevention of rattle and other sounds, and weight and cost reduction. In particular, an airtight connection between sheet metal parts and other parts, such as a frame member of housing to provide roof parts or side walls of the housing, or walls for any other purpose, is of great importance.

It is an important feature of housings or server cabinets to maintain conditioned (preferably cooled) air in the inside. In this way a greatest amount of conditioned air is able to reach the IT-equipment or other electrical, electronic and optical devices. Such a solution provides an ecological and economical benefit to users of the housings or server cabinets. It would be desirable, in order to maintain conditioned air within the housing or cabinet, to creating an airtight seal in the front (or back) of the cabinet, closing off as thoroughly as possible. However, achieving such an airtight seal is challenging, at least partly due to the need for an adjustable front (or back) of the cabinet, and the need for application of accessories of different shape and type.

Indeed, for connection, sheet metal wall parts may, in the known art, be provided with a number of openings, and the connection may be established by a screw with a head from which a threaded shank emanates that is provided through the openings of the thin metal sheet part and received and tightened in a cavity of the frame member, which serves as substrate part for the metal sheet part. Due to the openings, such connection may not be airtight.

It has therefore been proposed in NL2008988 or NL2008770 to add foil to the back of a sheet metal plate to seal the openings provided in the metal sheet plate for connection purposes. This solution is less practical, in particular because of the need for an additional sealing foil to seal the openings to achieve airtightness.

DE 10 2014 204292 discloses a metal part that is connected to another metal part through an intermittent adhesive layer. The metal part is provided with an opening that is sealed by a cover. The two metal parts are connected by drilling a pointed flow drill screw through the cover, opening and the other metal part. The cover prevents adhesive from being ejected, before the adhesive is finally cured.

GB 488,049 discloses a sheet metal part having an opening, a portion in its periphery extending radially outwards, and a slit extending radially into the body of the sheet metal element from one end of said portion. A portion of the element surrounding the opening is then pressed out of the plane of the element to produce a protuberance in the form of a conical frustum to provide a helix for engagement with the threads of the crew-threaded element. The sheet metal part has to have a thickness that is smaller than the pitch of the screw threads. The disclosed arrangement is self-locking in that it prevents the screw from being unscrewed.

It is an object of the present invention to prevent or at least partially obviate the above stated prior art drawbacks.

SUMMARY OF THE INVENTION

These and other objects are achieved by providing a sheet metal part for use in a housing for accommodating devices such as electrical, electronic and optical devices in accordance with claim 1. The invented sheet metal part comprises a penetrable opening that comprises an area in the metal sheet part that has been weakened by having weakened boundaries, through which penetrable opening the shank of a screw may be provided to bring the penetrable opening from an unpenetrated state to a penetrated state in order to mechanically and/or electrically connect a device or other part to the sheet metal part, wherein the penetrable opening in the unpenetrated state is covered by an airtight coating layer, has a central area configured to accommodate a threaded shank of the screw and a lug extending radially outward from the central area over some distance, and the lug of the penetrable opening is configured to bent back around its connection with the sheet metal part together with the central area without coming loose from the sheet metal part when the penetrable opening is brought in the penetrated state by the shank of the screw.

The sheet metal part of the invention achieves airtightness in a cost and time effective way. Indeed, using this innovation removes the need to cover openings provided in a sheet metal part for connection purposes afterward with a foil.

A penetrable opening in the context of the present invention is meant to comprise an area in the metal sheet part that has been weakened such that it is easily penetrable by the shank of a screw to bring it in a penetrated state. The weakened area is, at least in the unpenetrated state, covered by an airtight coating layer, such that it provides airtightness. In the penetrated state, the weakened area is moved away by the penetrating shank of a screw, and preferably remains covered by the airtight coating layer, which is then broken along the weakened boundaries.

The penetrable opening further has a central area of sheet metal, configured to accommodate a threaded shank of the screw and a lug extending radially outward from the central area over some distance. The lug of the penetrable opening is configured to be bent back with the central area without coming loose from the sheet metal part when the penetrable opening is brought in the penetrated state by the shank of the screw. In other words, the lug connects the moved away central part with the rest of the sheet metal part. This prevents release of any material from the penetrable opening when it is being penetrated (no debris). This also prevents the formation of any sharp edges, before and after having made the connection.

The sheet metal part of the invention further allows providing a connection by just fixing a screw with an (electric) screwdriver, and additional actions are not required. The connection provided is also strong enough to hold devices and other part(s), which are also easily detached by removing the screw connection. After removing the screw connection however, airtightness may be compromised.

In a preferred embodiment, the connection may conduct electricity, as will be elucidated further below.

A central area of the penetrable opening is configured to accommodate a threaded shank of the screw. An inner diameter of the penetrable opening is thereto slightly larger than the diameter of the screw shank, by which is meant that the screw shank may be provided unhindered into that part of the opening covered by the inner diameter.

The lug of the penetrable opening extends radially outward from the central area over some distance and may come in contact with the head of the screw. Countersunk screw heads as well as panhead screw heads may be used. In most applications, a panhead screw head may be used. When using a countersunk screw head, this screw is able to enter the penetrable opening such that a top surface of the countersunk head facing away from the shank may be flush or even lie below an outer surface of the sheet metal part when connected.

The threaded shank of the screw may be received and tightened in the penetrable opening, in particular the central area thereof. Alternatively, the threaded shank of the screw may be received and tightened in a cavity of a substrate part. The central area of the penetrable opening or other cavity may be threaded to cooperate with the screw threads to provide the connection. In another option, the central area of the penetrable opening or of the other cavity is not threaded but threads are produced in the side walls of the central area or cavity when providing and tightening the screw shank into the central area of the penetrable opening or cavity. The screw is then referred to as 'self tapping'.

A device or other part for connection with the sheet metal part may be made of metal but may also be made of any other suitable material that is preferably able to conduct electricity. A suitable material other than metal may be a polymer provided with electrically conducting fibers, such as carbon fibers for instance.

Another embodiment of the invention provides a sheet metal part wherein the airtight coating layer is provided at a side of the sheet metal part from which the screw should be provided. More preferred is an embodiment wherein the airtight coating layer is provided at a side of the sheet metal part that is opposite to the side from which the screw should be provided. Even more preferred is an embodiment wherein the provided at a side of the sheet metal part from which the screw is provided, and also at a side of the sheet metal part that is opposite to the side from which the screw is provided. The latter embodiment provides for good airtightness but also for easy penetrability.

The shape of the central area of the penetrable opening may be any shape suitable for the purpose, such as a polygonal shape or even an irregular shape. An embodiment of the sheet metal part wherein the central area is circular is preferred.

According to embodiments of the invention, the penetrable opening may be provided in the sheet metal part by laser cutting and/or by punching with a punching tool. Both methods provide weakened areas—areas with weakened boundaries—in the sheet metal part that provides the penetrable openings. The punching tool or laser creates an area of some shape in the sheet metal part, which area is sealed off in an airtight manner by a surface finishing that provides the airtight layer. Laser cutting is typically achieved along the weakened boundaries of the area that defines the penetrable opening. The weakened boundaries are then weakened by a reduced thickness or by being cut through the complete thickness of the sheet metal part. Punching with a tool that has about the shape of the area defining the penetrable opening may weaken the weakened boundaries by deforming these boundaries out of a plane of the sheet metal part.

The extent of the weakening may depend on the properties of the metal used in the sheet metal part, and on other properties such as the wall thickness of the sheet metal part.

The wall thickness of a sheet metal part is understood to mean the dimension of the part that is perpendicular to an areal extension of the part.

Weakening the sheet metal part in a weakened area may be achieved in many ways. In one embodiment, a weakened area is formed by reducing the wall thickness of the sheet metal part in the weakened area. In another embodiment, the sheet metal part may be weakened in a weakened area by (additionally) removing parts of the sheet metal part, such as by drilling through-the-thickness holes in the sheet metal part. A weakened area may thus be defined as an area of the thin sheet metal part that has reduced mechanical properties, such as stiffness and/or strength.

In an embodiment of the sheet metal part according to the invention, the penetrable opening extends over part of the thickness of the sheet metal part. By this is meant for instance that the weakened boundaries, such as defined by a cut in the sheet metal part, extend over part of the thickness of the sheet metal part.

To provide an easier penetrability, another embodiment of the sheet metal part according to the invention has the penetrable opening (and weakened boundaries) extending over the complete thickness of the sheet metal part.

A further improved sheet metal part according to yet another embodiment of the invention is characterized in that the airtight coating layer has a thickness and the penetrable opening (and weakened boundaries) in the unpenetrated state extends over the thickness of the sheet metal part and over, optionally part of, the thickness of the airtight coating layer.

Yet another useful embodiment may be obtained by laser cutting the metal sheet part to obtain the weakened areas. This embodiment has the advantage that a flush outer surface may be obtained between the penetrable openings and other parts of the sheet metal part.

It should be noted that the sheet metal part may contain a plurality of penetrable openings, and that any of these openings may be characterized according to one of the embodiments described heretofore.

The airtight coating layer on the sheet metal part may be provided by any method in the art. According to embodiments of the invention, the airtight coating layer provided on the sheet metal part comprises a coating layer selected from a powder coating layer, a wet paint coating layer, a low emissivity coating layer, also referred to as an E-coating layer, a hot dipped galvanizing layer, a zinc coating layer, and/or a plastic dip coating layer. Coatings for the intended purpose are known in the art and readily available from suppliers.

According to the invention, the penetrable opening of the sheet metal part in the unpenetrated state has a central area configured to accommodate a threaded shank of the screw and a lug extending radially outward from the central area over some distance, whereby the lug of the penetrable opening is configured to be bent back with the central area without coming loose from the sheet metal part when the penetrable opening is brought in the penetrated state by the shank of the screw. In the penetrated state, the material covered by the central area has been moved out of a plane of the sheet metal part by the screw shank while still being attached to the metal sheet part by the lug. The movement of the sheet metal material covered by the central area out of the plane of the sheet metal part creates the opening in the sheet metal part. The connection with the deformed lug prevents the material covered by the central area to become loose from the metal sheet part. As disclosed before, the material covered by the central area may comprise part of the sheet metal material and the airtight coating material, or the airtight coating material exclusively.

The penetrable opening may comprise a plurality of lugs or, in a preferred embodiment, may comprise one lug.

The lug or lugs extend radially outward from the central area over some distance from the diameter (or another characteristic dimension) of the central opening to an outer diameter. Any lug may extend over a distance that is shorter that the diameter (or the other characteristic dimension) of the central opening. Preferred embodiments however provide a radial distance of at least the diameter (or the other characteristic dimension) of the central area of the penetrable opening, more preferably of at least 1.2 the diameter (or the other characteristic dimension) of the central area of the penetrable opening, more preferably of at least 1.5 the diameter (or the other characteristic dimension) of the central area. Preferably, the radial distance should not exceed 2 times the diameter (or the other characteristic dimension) of the central area.

The above embodiments have the advantage that, when providing the screw into the central opening, the lug or lugs may be bent backwards without having to use an additional tool. Further, the bent lug and central opening material do not tend to fall off. Thirdly, when a user wants to cut off the bent lug, he may have to use a separate tool. This prevents the accidental cutting of the lug. Fourthly, the shapes of the lug are also designed to be blunt when penetrated. The risk of cutting any possible cabling around it is reduced thereby.

This advantage may also apply for the screw. The difference with a drilling screw is that the screw is blunt as well. Therefore, the risk of cutting any possible cabling around it is reduced as well, and the screw is less likely to create debris.

The lug(s) may be deformed by bending them around the outer diameter under the action of a penetrating screw head. In other words, the lug(s) remains attached to the rest of the sheet metal part.

The sheet metal part according to other useful embodiments provides a lug or lugs having rounded edges. Also, the lug in another embodiment is shaped such that the penetrable opening has a shape of a tennis racket. In another embodiment, the lug is shaped such that the penetrable opening has a drop-like shape.

Another embodiment of the invention provides a sheet metal part comprising a protective electrically insulating layer on a side facing a head of the screw to be provided through the penetrable opening, and the head is at a shank side thereof provided with a cutting edge that cuts through the electrically insulating layer when tightening the screw, thereby providing an electrical connection between the screw and the sheet metal part to bring them to the same voltage level or for grounding purposes. The cutting edge of the screw in such an embodiment makes the electrical connection with the sheet metal part. The shank of the screw makes the electrical connection with the sheet metal part where the lug is present, whereas the body of the screw makes the electrical connection at the same level of voltage, which may be ground level for some embodiments. In this way, an electrical connection may also be made with devices or other parts to which the metal sheet part is connected, including a second sheet metal part.

It will be clear to one skilled in the art which face of the claimed sheet metal part is meant to be penetrated by a screw. Indeed, in housing for accommodating devices such as electrical, electronic and optical devices, screws are typically provided in the walls of the housing from the outside.

It should be noted that a protective electrically insulating layer may not be needed in case of a zinc coating or hot dipped galvanizing layer.

The optional electrical connection between the screw, the sheet metal part and another part may be instrumental in providing an earthing or grounding connection. In an electrical installation, an earthing system or grounding system connects specific parts of said installation with the earth's conductive surface for safety and functional purposes.

It should be noted that the protective electrically insulating layer may be a separate layer from the airtight layer, but, in preferred embodiments, may be equal to the airtight layer, which then combines airtight with electrical insulating properties. Another embodiment may provide an airtight layer that further comprises the electrically insulating layer, for instance in the form of a bilayer construction.

The deformation of the lug or lugs when tightening the screw into the central opening or other cavity may be of any type. In an embodiment, the lug(s) is elastically deformed by the head upon tightening the screw. In this embodiment, untightening the screw and undoing the connection between the thin sheet metal part and the substrate part may result in recovering the deformation of the lug(s) to their original state. In another preferred embodiment, the lug(s) is plastically deformed by the screw head upon applying or tightening the screw. In this embodiment, untightening the screw will leave the lug(s) in its deformed state. In other words, in this embodiment the deformation of the lug(s) of a penetrable opening in the sheet metal part is permanent, once deformed.

The sheet metal part may have any shape. It may for instance be strip- or plate-shaped, or may have a profiled cross-section. The sheet metal part may be preferably used as part of an enclosure or housing for accommodating devices such as electrical, electronic and optical equipment, in particular computer equipment. The metal sheet part may have a wall thickness not exceeding 3 mm. In other embodiments, the wall thickness of the sheet metal part does not exceed 1.8 mm, more preferably does not exceed 1.6 mm, more preferably does not exceed 1.4 mm, and even more preferably does not exceed 1.1 mm. In most embodiments, the sheet metal part will have a constant wall thickness. If not, the wall thickness of the sheet metal part corresponds to its wall thickness at the position of the penetrable opening(s). In other words, the sheet metal part may be thicker at positions other than the penetrable opening position(s), for instance between penetrable opening positions. The wall thickness of the sheet metal part is preferably larger than the pitch of the screws that penetrate the penetrable openings in the sheet metal part. This allows the screws to be threaded in the sheet metal part, either by preformed threads or by self-threading.

A plurality of the openings may be provided in any area or part of the sheet metal part. Although the position of the openings may be arbitrary, an embodiment of the invention relates to a sheet metal part comprising a plurality of the penetrable openings arranged along a side edge of the sheet metal part. It will be understood that the sheet metal part may also comprise a plurality of other openings, optionally arranged along a side edge of the sheet metal part. The other openings are not penetrable in accordance with the invention.

Another aspect of the invention relates to an assembly of a sheet metal part according to the invention and a device or other part connected thereto, the connection being provided by a screw with head from which a shank emanates that is provided through the penetrable opening(s).

The other part may have any shape, and preferably comprises a cavity for receiving and tightening the threaded shank of the screw.

The invented metal sheet part is preferably used in an enclosure for accommodating devices such as electrical, electronic and optical equipment, in particular computer equipment, and/or in a corridor between such enclosures or housings. Another aspect of the invention therefore relates to a housing for accommodating devices such as electrical, electronic and optical devices, comprising at least one metal sheet part in accordance with the present disclosure. The sheet metal part may for instance comprise a wall of the housing, selected from an airtight wall, an air blocking wall, a bottom wall or a roof wall of the housing, and/or a corridor wall between housings.

Other parts may relate to strips, or to a mounting rail, preferably an extruded mounting rail, provided with a number of cavities or holes. These examples are only given for illustrative purposes and should not be construed as limiting the invention.

The embodiments of the invention described in the present disclosure may be combined in any possible combination of these embodiments, and each embodiment can individually form the subject-matter of a divisional patent application.

BRIEF DESCRIPTION OF THE FIGURES

The invention will now be further elucidated on the basis of several non-limitative embodiments, as shown in the attached schematic figures. In the figures.

DESCRIPTION OF EXEMPLARY EMBODIMENTS

Figure 1:
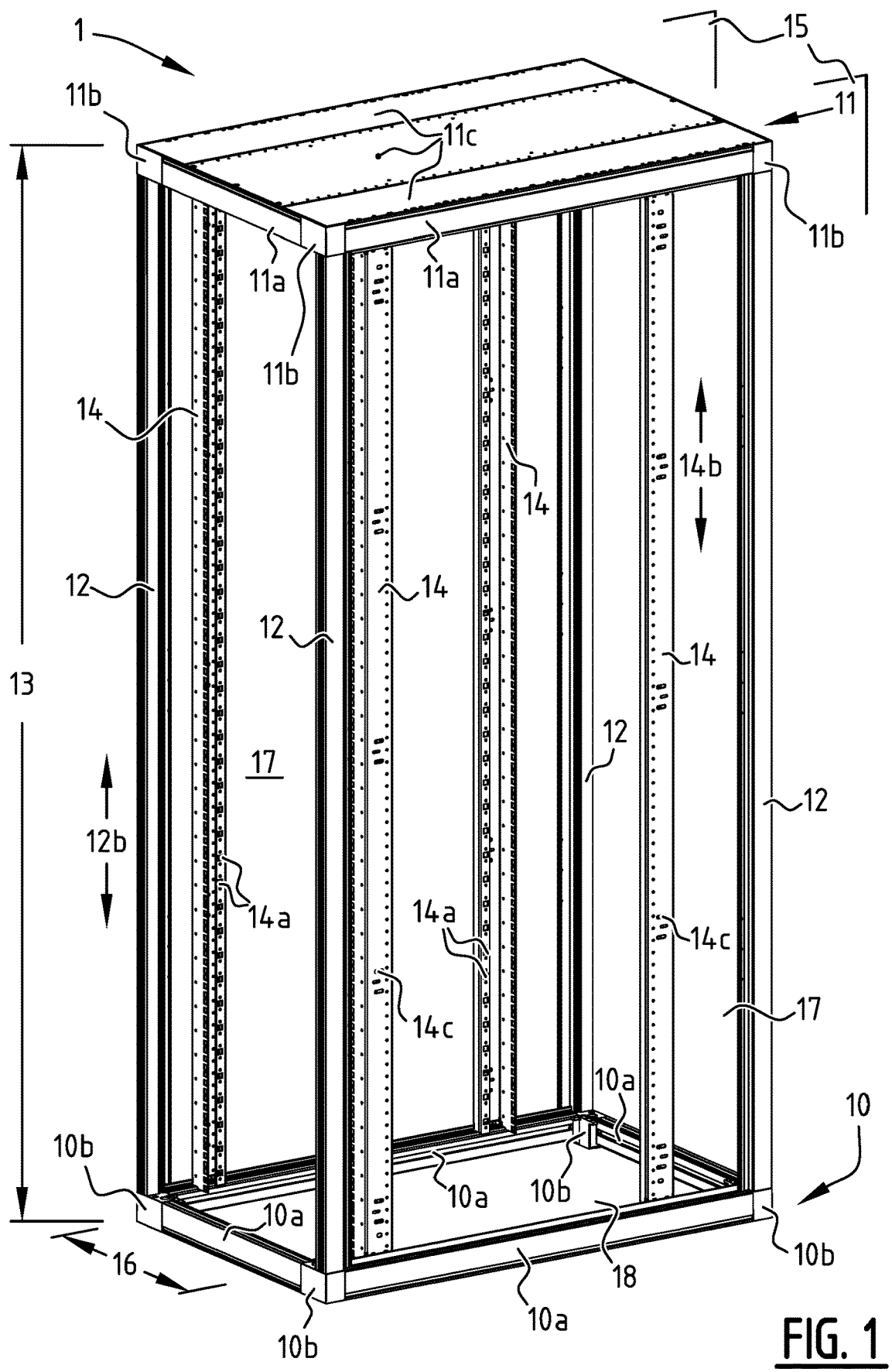
FIG. 1 represents a perspective view of a housing or rack in which the invention may be applicable.

Referring to FIG. 1, a rack 1 for accommodating devices such as electrical, electronic and optical equipment (not shown) according to an embodiment of the invention is shown. The rack comprises a rectangular floor 10 comprising four interconnected floor frame members 10a that extend between four floor corner elements 10b. Likewise, a rectangular roof 11 is provided, which comprises four interconnected roof frame members 11a that extend between four roof corner elements 11b. The floor 10 and roof 11 are held at a vertical distance 13 from each other by vertically extending side frame members 12, each side frame member 12 being provided between a floor corner element 10b and a roof corner element 11b. The frame members 10a, 11a and 12, and the corner elements (10b, 11b) together form a load bearing structure for accommodating equipment.

The roof 11 in the embodiment shown is provided with three contiguous roof plates 11c made from a thin sheet metal, preferably steel. The sheet metal plates 11c have a thickness of 1.0 mm, but may have another thickness. In the embodiment shown in FIG. 1, two vertically oriented mounting rails 14 are provided in between each pair of side frame members 12, at least in two side planes 15 of the rack 1. Each mounting rail 14 is at an end thereof connected to a floor frame member 10a, and a roof frame member 11a, according to known practice. The 19 inch mounting rails 14 extend parallel to each other at a mutual standardized distance 16 of typically 17.7 inches. Each mounting rail 14 is further provided with a plurality of square openings 14a, extending along a longitudinal direction 14b of each mounting rail 14, and provided at equal height between mounting rails 14. Standardized, suitable equipment may be provided with fixation lips to be connected to the openings 14a, for instance by screws. In this way, multiple units of equipment (not shown) may be suspended on top of each other in the rack 1. The mounting rails 14 may be provided with other openings 14c for the same purpose, or for connecting to auxiliary parts of the rack 1, such as stiffening brackets, side walls (not shown) and the like. The rack 1 may, apart from the roof plates 11c that together form a roof wall part, be provided with other wall parts, such as side wall parts 17 or floor wall parts 18 to form a substantially closed cabinet. Surfaces of the roof plates 11c may be provided with a protective electrically insulating layer, such as a powder coating layer 111. Such a layer 111 protects the roof plates 11c but, on the other hand, electrically insulates the roof plates 11c, which may not be desirable for grounding purposes.

Figure 2:
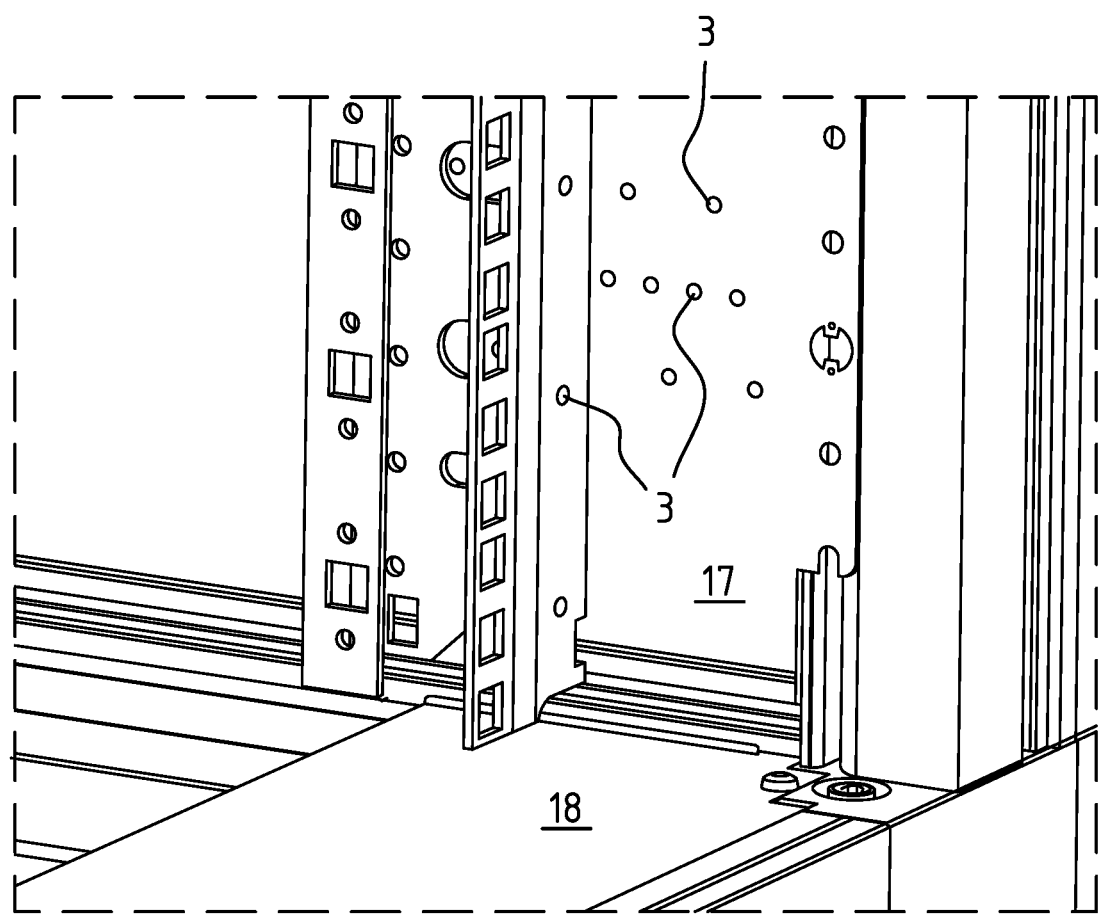
FIG. 2 represents a detail of the rack shown in FIG. 1.

Referring now to FIG. 2, a detail of a floor corner of the rack 1 is schematically shown. As shown, sheet metal parts such as side wall parts 17 may be provided with a plurality of openings 3. The openings 3 are shown as open, but according to the invention qualify to be embodied as penetrable openings 5 in accordance with embodiments of the invention. Possible shapes of these penetrable openings 5 will be elucidated further below, for instance with reference to FIGS. 3, 4 and 5.

Figure 6A:
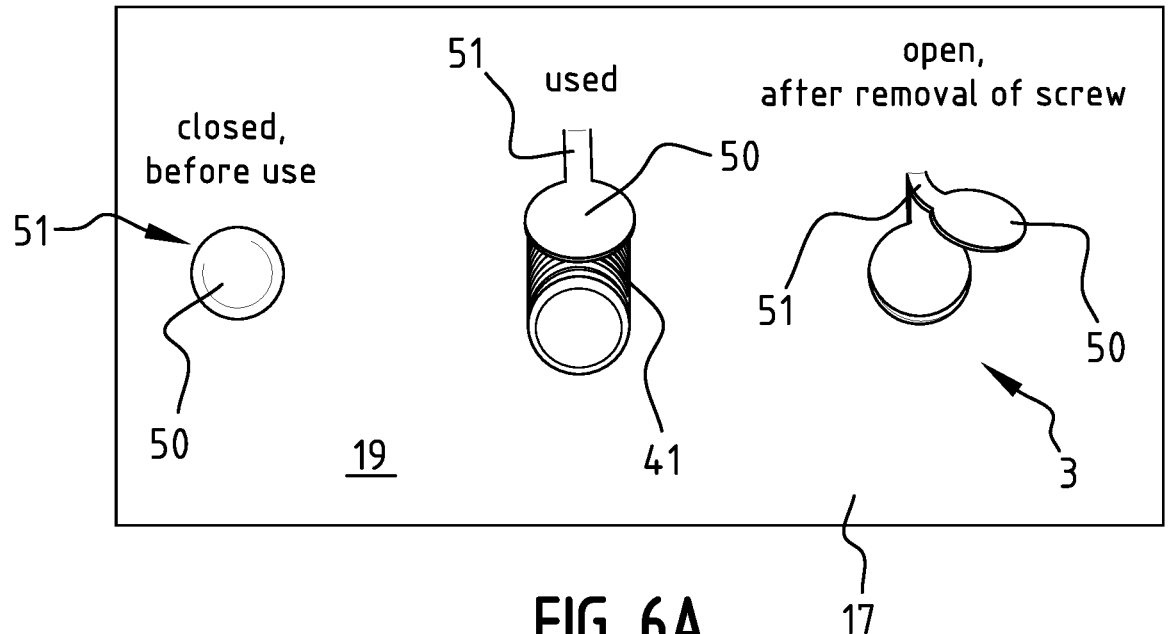
FIG. 6A represents a schematic back view of a thin sheet metal part comprising an opening according to an embodiment of the invention in a closed (left), a used (middle) and an open state (right)
Figure 6B:
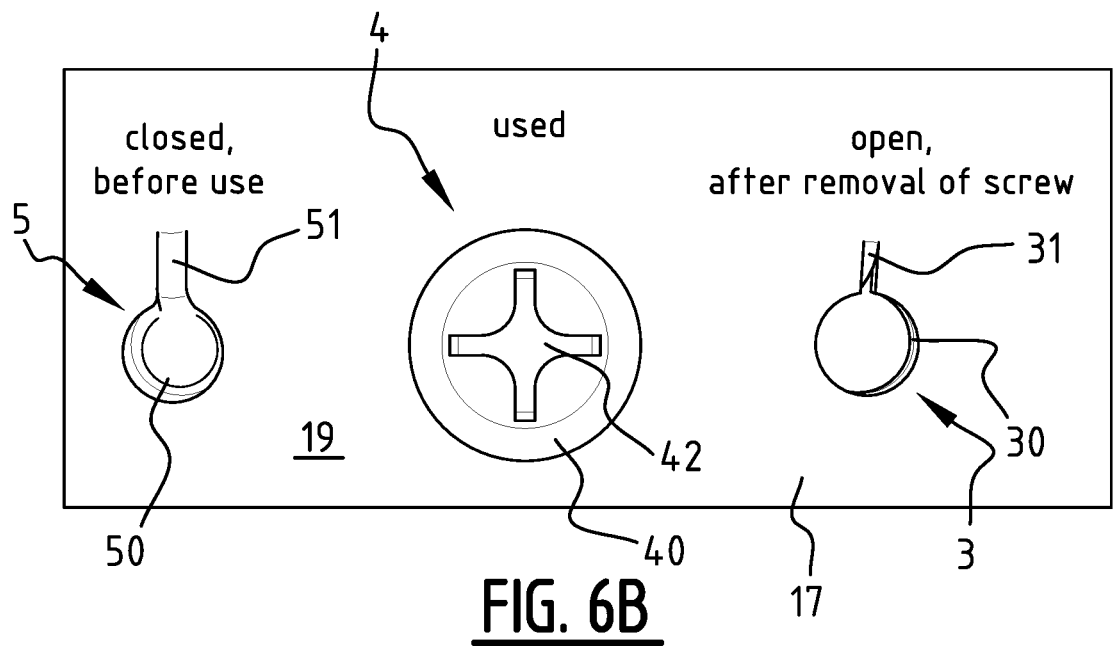
FIG. 6B finally represents a schematic front view of the thin sheet metal part of FIG. 6A in a closed (left), a used (middle) and an open state (right).

According to the invention, and for instance shown in the embodiment of FIGS. 6A and 6B, the sheet metal part in the form of wall part 17 comprises a penetrable opening 5 through which the shank 41 of a screw 4 may be provided to bring the penetrable opening 5 from an unpenetrated state (left side of FIGS. 6A and 6B, referred to as 'closed, before use') to a penetrated state (middle of FIGS. 6A and 6B, referred to as 'used') in order to mechanically and/or electrically connect a device or other part to the wall part 17. As shown, the penetrable opening 5 in the unpenetrated state is covered by an airtight coating layer 19 which closes off the underlying opening. The right side of FIGS. 6A and 6B, referred to as 'open, after removal of screw' shows the penetrable opening 5 as an open opening 3, resulting from removing the screw 4 from the penetrable opening 5 in the penetrated state.

Please note that the states referred to as 'closed, before use' (left) and 'used' (middle) provide airtightness to the wall part 17, whereas the state referred to as 'open, after removal of screw' does not.

To make the connection, any suitable screw 4 may comprise a head such as a panhead head 40 from which a threaded shank 41 emanates. The head 40 may be provided with a recess 42 for receiving a screw driver. The head 40 may at a shank side thereof be provided with a cutting edge (not shown) that cuts through the airtight coating layer 19, that for this purpose is also electrically insulating, when tightening the screw 4. This provides an electrical connection between the screw 4 and the wall part 17, for instance to bring these parts to the same voltage or for grounding purposes.

Figure 3A:
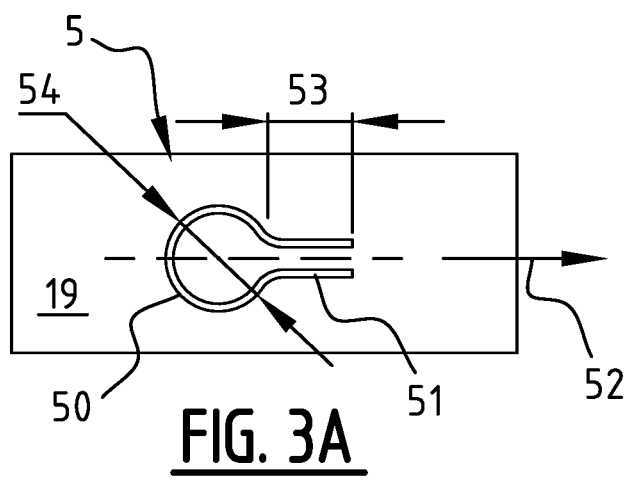
FIG. 3A represents a schematic top view of a sheet metal part provided with a penetrable opening according to an embodiment of the invention.
Figure 3B:
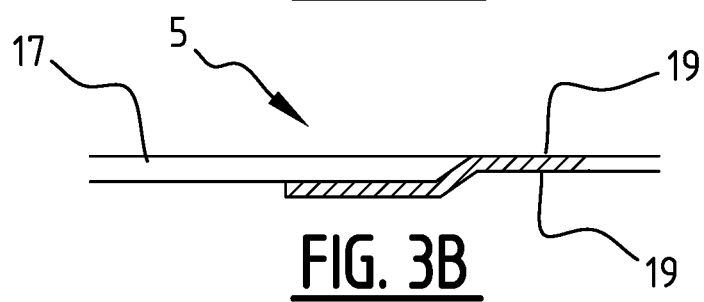
FIG. 3B represents a schematic side view of the sheet metal part of FIG. 3A according to an embodiment of the invention.

An embodiment of a penetrable opening 5 is schematically shown in FIGS. 3A (top view) and 3B (side view). The penetrable opening 5 in the unpenetrated state is covered by an airtight coating layer 19 and further is defined by a central circular area 50 configured to accommodate the threaded shank 41 of the screw 4. A lug 51 is seen to extend in a radial direction 52 outward from the central area 50 over some distance 53, which in the embodiment shown is about 3.8 mm. The lug is shaped such that the penetrable opening 5 has a shape of a tennis racket. The central area has a diameter 54 of about 3.15 mm. As shown in FIG. 3B, the penetrable opening 5 is made by punching the wall part 17 or other sheet metal part with a punching tool to deform the wall part 17 in the shape of the penetrable opening 5. This deformed wall part is also shown in FIGS. 6A and 6B (left) and the boundaries thereof are weakened and will tend to break easily when a screw 4 is inserted in the penetrable opening 5. When the shank 41 of the screw 4 penetrates the central area 50, this central area 50 will be moved together with the lug 51 to which it remains connected. This situation is for instance shown in the middle of FIGS. 6A and 6B. In this process, the lug 51 of the penetrable opening 5 is bent back around its connection with the rest of the sheet metal part 17 together with the central area 50 without coming loose from the sheet metal part 17. The connection between the lug 51 and the rest of the sheet metal part 17 remains in place. As shown at the right of FIG. 6B, after removal of the screw there remains an opening 3 which has the shape of the penetrable opening 5 comprising an open circular central area 30 and an open lug shape 31. The lug 51 and moved central part 50 may remain attached to the sheet metal part 17, as shown at the right of FIG. 6A, but may also be removed with a tool.

Figure 4:
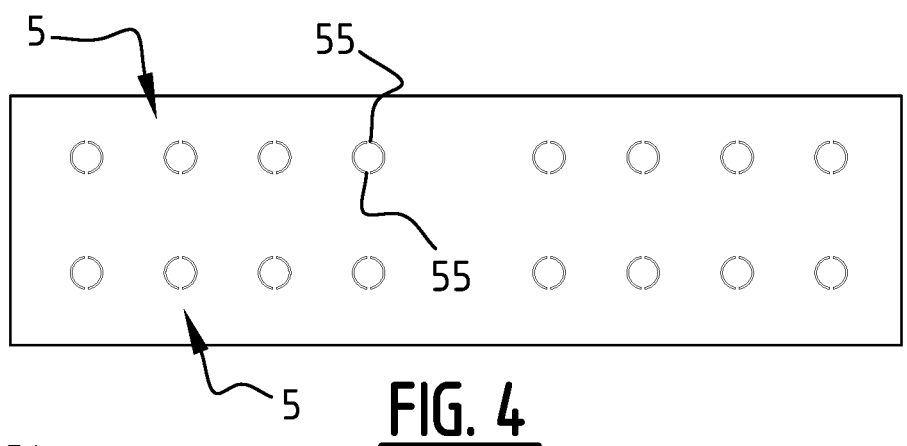
FIG. 4 represents a schematic top view of a sheet metal part provided with a penetrable opening according to another embodiment of the invention.
Figure 5:
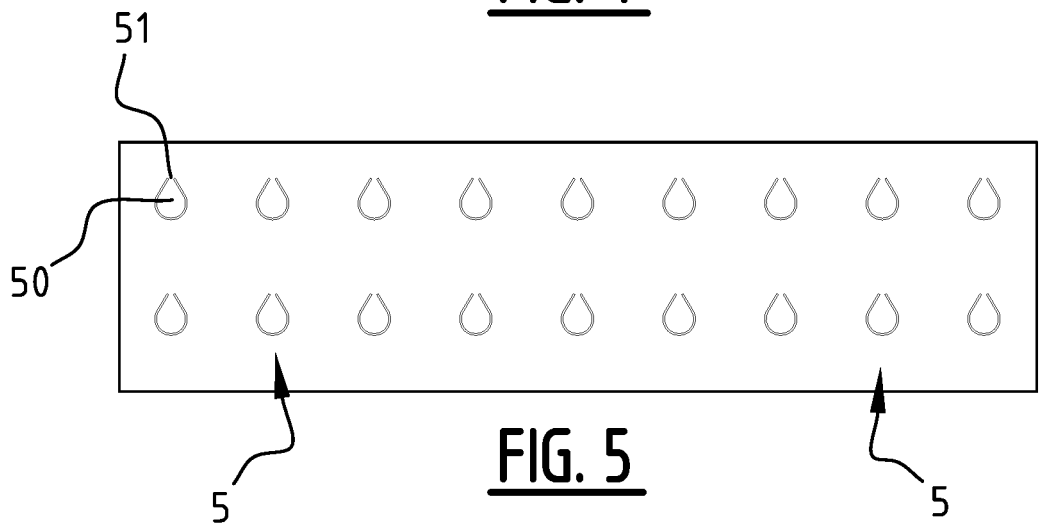
FIG. 5 represents a schematic top view of a sheet metal part provided with a penetrable opening according to yet another embodiment of the invention.

Other embodiments of the penetrable opening 5 are shown in FIGS. 4 and 5. These embodiments were made by laser cutting boundaries of the penetrable opening 5 to form weakened areas in the sheet metal part 17. The weakened areas will preferentially break along the boundaries when a screw 4 is inserted into the penetrable opening 5.

The embodiment of FIG. 4 shows a number of circular penetrable openings 5 comprising round holes attached to the rest of the sheet metal part 17 through ribs 55, made by laser cutting. Embodiments having to diametrically opposed ribs tend to need some force to push it out. Also, round parts may come loose from the sheet metal part 17 more easily, potentially leaving debris.

The embodiment of FIG. 5 shows a number of improved penetrable openings 5 having a lug 51 that is shaped such that the penetrable openings 5 have a drop-like shape, made by laser cutting as well. This embodiment may show a relatively weak connection between the lug 51 and the rest of the sheet metal part 17 (because it has less material around the screw 4 when inserted in the opening). This embodiment may be selected when it is desired to easily break off the penetrable opening material after insertion and removal of the screw 4.

It will be apparent that many variations of the above described embodiments may be envisaged by one skilled in the art within the scope of the invention as determined by the attached claims.

The invention claimed is:

1. A sheet metal part for use in a housing for accommodating devices, the sheet metal part comprising:
a penetrable opening that comprises an area in the metal sheet part that has been weakened by having weakened boundaries, through which a threaded shank of a screw may be provided to bring the penetrable opening from an unpenetrated state to a penetrated state in order to mechanically and/or electrically connect a device or other part to the sheet metal part,
wherein the penetrable opening being in a closed and unpenetrated state is covered by an airtight coating layer, and includes a central area of sheet metal in the plane of the sheet metal part configured to accommodate the threaded shank of the screw, and a lug in the plane of the sheet metal part extending radially outward from the central area over a distance, and
wherein the lug of the penetrable opening is configured to be bent back around its connection with the sheet metal part together with the central area while remaining attached to the sheet metal part when the penetrable opening is brought in an open and penetrated state by the threaded shank of the screw.

2. The sheet metal part according to claim 1, wherein the airtight coating layer is provided at one or both sides of the sheet metal part.

3. The sheet metal part according to claim 1, wherein the central area is circular.

4. The sheet metal part according to claim 1, wherein the penetrable opening extends over part of a thickness of the sheet metal part or extends over the complete thickness of the sheet metal part.

5. The sheet metal part according to claim 1, wherein the airtight coating layer has a thickness and the penetrable opening in the unpenetrated state extends over the thickness of the sheet metal part and, optionally, over part of the thickness of the airtight coating layer.

6. The sheet metal part according to claim 1, wherein the airtight coating layer comprises a coating layer selected from a powder coating layer, a wet paint coating layer, a low-emissivity coating layer, an Electro-coating layer, a hot dipped galvanizing layer, a zinc coating layer, and/or a plastic dip coating layer.

7. The sheet metal part according to claim 1, wherein the lug extends radially outward from the central area over a distance of at least a diameter of the central area of the penetrable opening.

8. The sheet metal part according to claim 1, wherein the penetrable opening comprises one lug only.

9. The sheet metal part according to claim 1, wherein the lug has rounded edges.

10. The sheet metal part according to claim 1, wherein the lug is shaped such that the penetrable opening has a shape of a tennis racket and/or has a drop-like shape.

11. The sheet metal part according to claim 1, wherein the penetrable opening has been provided in the sheet metal part by laser cutting the boundaries of the weakened area to weaken the boundaries by a reduced thickness or by being cut through the complete thickness of the sheet metal part and obtain a flush outer surface between the penetrable opening and other parts of the sheet metal part, and/or by punching the weakened area with a punching tool that has a shape of the area defining the penetrable opening and weaken the boundaries by deforming these boundaries out of a plane of the sheet metal part.

12. The sheet metal part according to claim 1, wherein the lug of the penetrable opening is configured to be bent back plastically upon tightening the screw.

13. The sheet metal part according to claim 1, wherein the sheet metal part comprises a plurality of the penetrable openings arranged along a side edge of the sheet metal part.

14. The sheet metal part according to claim 1, wherein a wall thickness of the sheet metal part does not exceed 3 mm.

15. An assembly of a sheet metal part according to claim 1 and a device or other part connected thereto, the connection being provided by a screw with a head from which a shank emanates that is provided through the penetrable opening.

16. The assembly according to claim 15, wherein the sheet metal part comprises a protective electrically insulating layer on a side facing a head of the screw to be provided through the penetrable opening, and the head is at a shank side thereof provided with a cutting edge that cuts through the electrically insulating layer when tightening the screw, thereby providing an electrical connection between the screw and the sheet metal part to bring them to the same voltage level or for grounding purposes.

17. The assembly according to claim 15, wherein the shank is received and tightened in a cavity of the device or other part.

18. A housing for accommodating devices, the housing comprising at least one sheet metal part according to the assembly in accordance with claim 15.

19. A housing for accommodating devices, the housing comprising at least one sheet metal part according to claim 1.

20. The housing according to claim 18, wherein the sheet metal part comprises a wall of the housing, selected from an upstanding front, back or corridor wall, a floor wall or a roof wall of the housing.

* * * * *